United States Patent
Bushnell et al.

(10) Patent No.: US 10,734,997 B2
(45) Date of Patent: Aug. 4, 2020

(54) TOUCH AND FORCE SENSITIVE ROCKER SWITCH

(71) Applicant: Apple Inc., Cupertino, CA (US)

(72) Inventors: Tyler S. Bushnell, Mountain View, CA (US); Adam T. Clavelle, San Francisco, CA (US); Sameer Pandya, Sunnyvale, CA (US); Sherry Tang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/144,901

(22) Filed: Sep. 27, 2018

(65) Prior Publication Data

US 2019/0036529 A1 Jan. 31, 2019

Related U.S. Application Data

(63) Continuation of application No. 15/269,951, filed on Sep. 19, 2016, now Pat. No. 10,116,306.

(51) Int. Cl.
*G06F 1/16* (2006.01)
*H03K 17/96* (2006.01)

(52) U.S. Cl.
CPC ......... *H03K 17/9618* (2013.01); *G06F 1/163* (2013.01); *G06F 1/1656* (2013.01); *H03K 17/962* (2013.01)

(58) Field of Classification Search
CPC ...................................... G06F 1/163
USPC ...................................... 361/679.3
See application file for complete search history.

(56) References Cited

U.S. PATENT DOCUMENTS

| | | | |
|---|---|---|---|
| 5,917,165 A | 6/1999 | Platt et al. | |
| 6,667,563 B2 | 12/2003 | Bae et al. | |
| 7,232,973 B2 | 6/2007 | Kaps et al. | |
| 8,178,808 B2 | 5/2012 | Strittmatter | |
| 9,063,623 B2 | 6/2015 | Royhob | |
| 9,244,562 B1 | 1/2016 | Rosenberg et al. | |
| 10,116,306 B2 | 10/2018 | Bushnell et al. | |
| 10,387,020 B2* | 8/2019 | Cauwels | A61B 5/6898 |
| 2001/0024210 A1* | 9/2001 | Armstrong | G04G 21/08 715/701 |
| 2008/0054039 A1* | 3/2008 | Wulff | A45F 5/00 224/575 |
| 2012/0217982 A1* | 8/2012 | Narayanasamy | H03K 17/962 324/686 |
| 2013/0083496 A1 | 4/2013 | Franklin et al. | |
| 2013/0120459 A1 | 5/2013 | Dickinson et al. | |

(Continued)

*Primary Examiner* — Anthony Q Edwards
(74) *Attorney, Agent, or Firm* — Dickinson Wright RLLP

(57) ABSTRACT

A touch and force sensitive rocker switch or button array for a portable electronic device can include multiple dome switches or force sensors, as well as a capacitive sensing surface that can detect finger location and swipes. A cosmetic surface can cover the entire elongated switch/button and portions of device housing proximate the button, and can be configured to transfer each of multiple types of input there through to the button and also provide a seal to the device housing interior. The cosmetic surface can be a flexible polymer to allow local deformation, and/or the entire surface can tilt or bend to permit inputs to transfer there through. The elongated button/switch can be raised from a surface of the device, and can be located along a side of the device, with a front face of the device being a touchscreen, such as for a smart phone or watch.

20 Claims, 10 Drawing Sheets

(56) References Cited

U.S. PATENT DOCUMENTS

| | | | | |
|---|---|---|---|---|
| 2013/0331058 | A1* | 12/2013 | Harvey | H04W 4/90 |
| | | | | 455/404.2 |
| 2014/0002113 | A1 | 1/2014 | Schediwy et al. | |
| 2014/0354577 | A1 | 12/2014 | Hanssen et al. | |
| 2015/0133193 | A1 | 5/2015 | Stotler | |
| 2015/0234501 | A1 | 8/2015 | Lyons | |
| 2015/0331394 | A1* | 11/2015 | Jang | G04G 21/04 |
| | | | | 368/281 |
| 2015/0338979 | A1* | 11/2015 | Rhee | G06F 3/0414 |
| | | | | 345/174 |
| 2015/0346877 | A1* | 12/2015 | Justice | G06F 3/047 |
| | | | | 345/173 |
| 2016/0029899 | A1* | 2/2016 | Kim | A61B 5/02438 |
| | | | | 455/414.1 |
| 2016/0070393 | A1* | 3/2016 | Sharma | G06F 1/163 |
| | | | | 345/174 |
| 2016/0134737 | A1* | 5/2016 | Pulletikurty | G06F 3/0227 |
| | | | | 715/735 |
| 2017/0032168 | A1* | 2/2017 | Kim | H04L 63/0861 |
| 2018/0239527 | A1* | 8/2018 | Kwon | G06F 3/16 |
| 2018/0248991 | A1* | 8/2018 | Ryu | G06F 3/0346 |
| 2018/0343024 | A1* | 11/2018 | Sahebjavaher | G06F 15/00 |
| 2019/0069154 | A1* | 2/2019 | Booth | G06F 1/3231 |

\* cited by examiner

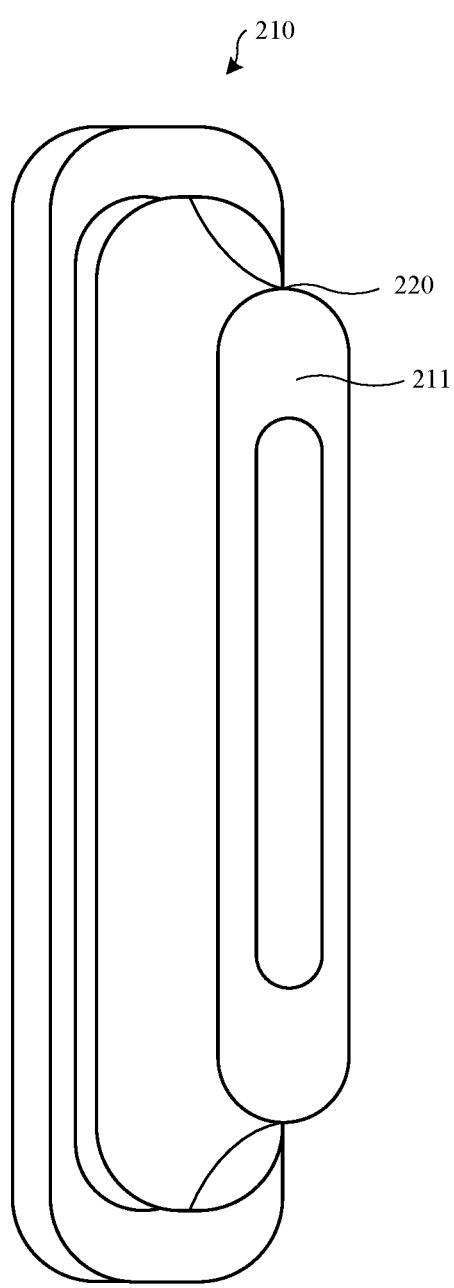
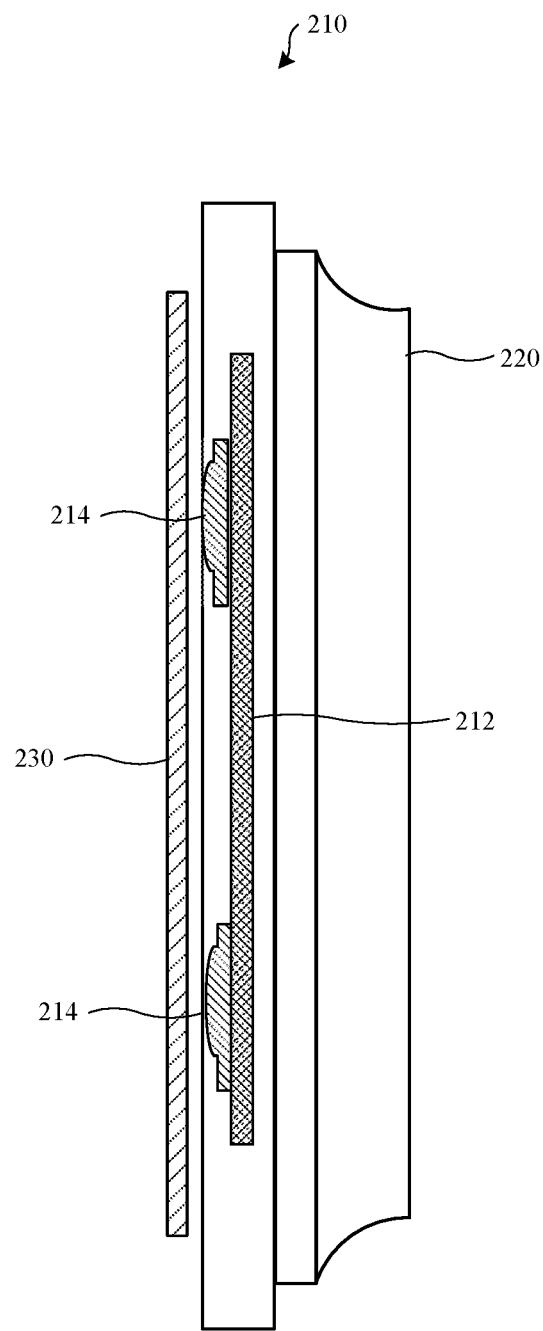
FIG. 3A
FIG. 3B

TOUCH AND FORCE SENSITIVE ROCKER SWITCH

CROSS-REFERENCE TO RELATED APPLICATIONS

The present application is a continuation of U.S. application Ser. No. 15/269,951, entitled "TOUCH AND FORCE SENSITIVE ROCKER SWITCH," filed Sep. 19, 2016, the content of which is incorporated herein by reference in its entirety for all purposes.

FIELD

The described embodiments relate generally to consumer electronic devices. More particularly, the described embodiments relate to input components that are used in conjunction with consumer electronic devices.

BACKGROUND

Input components that are used in conjunction with consumer electronic devices are known. Various electronic devices can include visual displays having touch screens that include sensors designed to receive touches, gestures, and other inputs in response to touches to the display. Such electronic devices can also have one or more buttons, dials, touch surfaces, data ports, and other input components. Often the desire for various types of input results in multiple different input components, which can be cumbersome or more complex in some cases. While electronic devices having multiple different input components have thus worked well in the past, there can be room for improvement. Accordingly, there is a need for electronic devices having improved types of input components.

SUMMARY

Representative embodiments set forth herein disclose various structures, methods, and features for the disclosed input components. In particular, the disclosed embodiments set forth touch and force sensitive rocker switches and similar multiple type input buttons.

In some embodiments, an electronic device button assembly configured to be carried by an electronic device housing can include at least: 1) a sensor array having first and second sensors that sense first and second inputs; and 2) a cosmetic surface configured to cover at least the entire sensor array and portions of the electronic device housing proximate the sensor array. The first and second input sensors sense the first and second inputs through the cosmetic surface.

In some embodiments, a portable electronic device having a housing, a processor, and a display screen can also include at least: 1) a button carried within an opening along one side of the housing, and 2) a cosmetic surface having a first layer that covers portions of the housing proximate the button and a second layer that covers the first layer and the entire button. The button can be coupled to the processor and be configured to accept multiple different types of input. The second layer can have a varying thickness, and the cosmetic surface can provide a seal to the interior of the housing.

In various embodiments, the button can be elongated and raised from the surface of the housing. Different types of button inputs can include touch and force inputs. The cosmetic surface can include a flexure region to permit downward movement of the button, can be made of a plastic material, and can be formed by way of a two shot co-molding. A seal to the housing interior can make the device waterproof, which device can be a smart watch. Other embodiments include methods for accepting inputs on electronic devices with multiple type input buttons.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

BRIEF DESCRIPTION OF THE DRAWINGS

The included drawings are for illustrative purposes and serve only to provide examples of possible structures and methods for the disclosed touch and force sensitive rocker switches and similar multiple type input buttons. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

FIG. 3A illustrates in side perspective view the button region of the exemplary portable electronic device of FIG. 2 according to various embodiments of the present disclosure.

FIG. 3B illustrates in side elevation and partially cutaway view the button region of the exemplary portable electronic device of FIG. 2 according to various embodiments of the present disclosure.

DETAILED DESCRIPTION

Touch and force sensitive rocker switches and similar multiple type input buttons that can be used in conjunction with electronic devices can provide for multiple different types of input in a simpler and more aesthetically pleasing way. According to various embodiments, a portable electronic device can have a housing, a processor, a display screen, a rocker switch or other specialized input button located along one side of the housing, and a cosmetic surface that covers at least the entire button and portions of housing proximate the button. The button can be coupled to the processor and be configured to accept multiple different types of input. The cosmetic surface can transfer each of the multiple types of input there through to the button and also provide a seal to the housing interior.

In some embodiments, the multiple type input button can be elongated and raised from the surface of the housing. The different types of input for the button can include touch inputs, such as by capacitance sensors, as well as a force inputs, such as by dome loaded button switches. The touch inputs can include swipes or gestures, as well as simple touches at multiple locations along the button. The cosmetic surface can include a flexure region that permits downward movement of the button. The cosmetic surface can be made of a plastic material, and can be formed by way of a two shot co-molding. The seal to the housing interior can render the device waterproof. The electronic device can be a smart watch, among other possible devices.

The foregoing approaches provide various structures and methods for the disclosed magnetically aligned accessory to device connections. A more detailed discussion of these structures, methods, and features thereof is set forth below and described in conjunction with FIGS. 1-10, which illustrate detailed diagrams of devices and components that can be used to implement these structures, methods, and features.

Figure 1A:
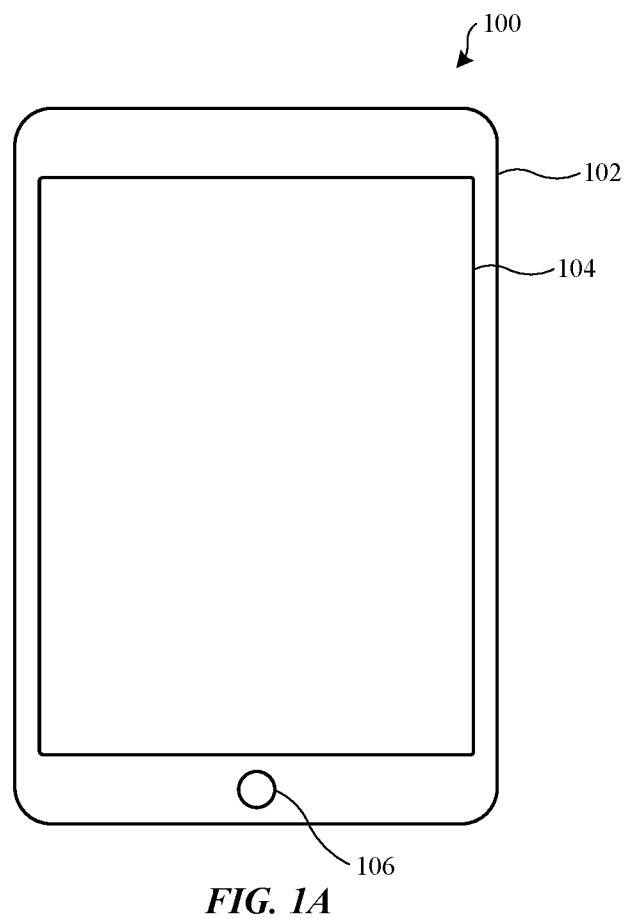
FIG. 1A illustrates in top plan view an exemplary portable electronic device according to various embodiments of the present disclosure.
Figure 1B:
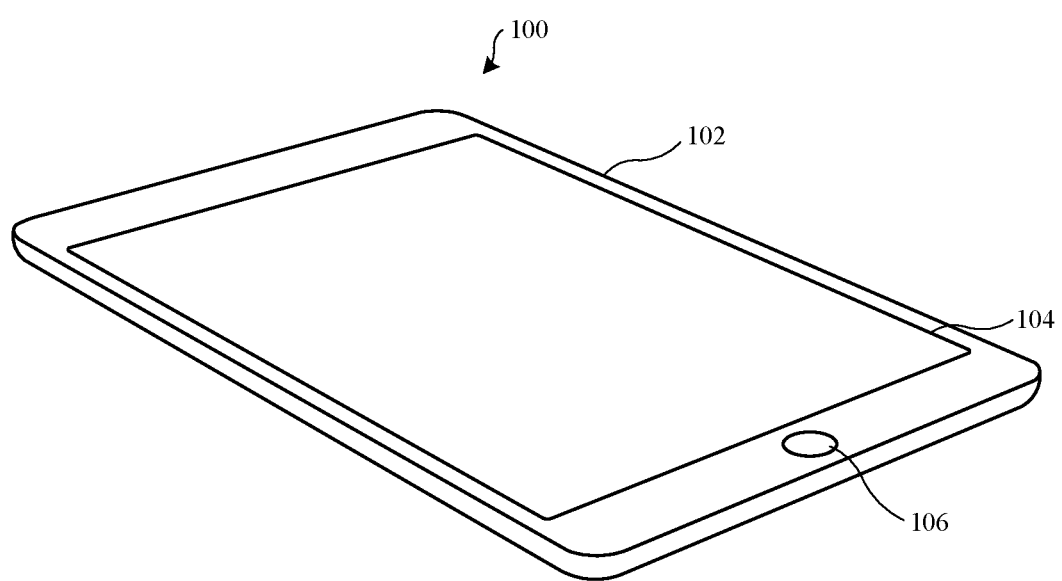
FIG. 1B illustrates in front perspective view the exemplary portable electronic device of FIG. 1A according to various embodiments of the present disclosure.

Turning first to FIGS. 1A and 1B, an exemplary portable electronic device is illustrated in top plan and front perspective views. Portable electronic device 100 can be a tablet computing device, for example, although other similar types and varieties of electronic devices can also apply for the various disclosed components and features disclosed herein. For example, the various specialized types of input buttons and cosmetic surfaces disclosed herein could also be used with a smart phone, a media playback device, a personal digital assistant, a laptop computer, and a smart watch, among other possible electronic devices. Portable electronic device 100 can include an outer housing 102, which can be adapted to hold a processor and other electronic components inside, and can also provide space for an exterior touchscreen or other display 104, and one or more buttons, such as home button 106, among other possible device components. One or more additional buttons (not shown) can be located along a side of portable electronic device, details of which are provided in greater detail below.

Figure 2:
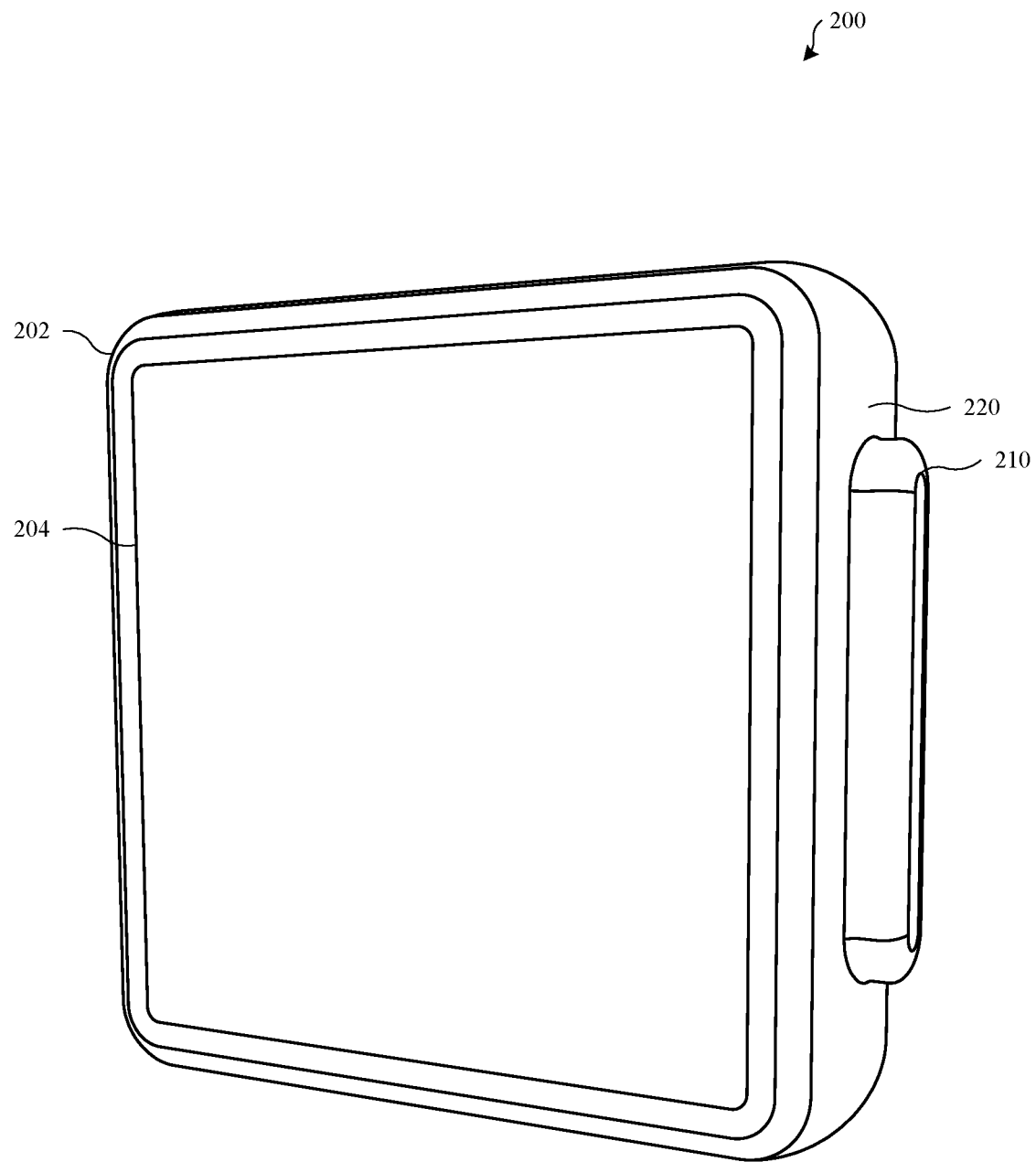
FIG. 2 illustrates in front perspective view another exemplary portable electronic device according to various embodiments of the present disclosure.

Continuing with FIG. 2, another exemplary portable electronic device according to various embodiments of the present disclosure is illustrated in front perspective view. Smart watch 200 can include an outer housing 202 having an interior, front, back, and one or more sides. Housing 202 can be adapted to hold a processor and other electronic components inside, and can also provide space for an exterior touchscreen or other display 204. Button 210 can be a specialized multiple input component that is located along a side of the outer housing 202. Button 210 can be a touch and force sensitive rocker switch or other similar multiple input type button, for example. As shown, button 210 can be elongated and can be raised above the surface of the housing 202. A cosmetic surface 220 can cover all of button 210 and at least the portions of the housing 202 that are proximate the button.

In various embodiments, button 210 can suitably replace what would ordinarily be multiple separate input components. For example, button 210 can provide inputs suitable for scrolling a display and making a selection, such as what might be possible by way of a separate scroll wheel and push button. This can be accomplished by having multiple different types of input be possible on the same button 210. Such multiple different types of input can include touch inputs and also downward motion, force, or other button actuation inputs. Other types of inputs may also be possible on the same button 210. In this manner, a user of the electronic device can provide different types of input at different times or simultaneously on the same button 210. For example, a user may press downward on the button 210 at the same time as providing a swipe across the surface of the button. Accordingly, multiple different types of input sensors can be associated with button 210, as set forth in greater detail below.

In addition, the cosmetic surface 220 can cover the entire button 210 and at least the portions of the housing 202 that are proximate to the button. In some embodiments, the cosmetic surface 220 can cover all or most of the housing as well as the button 210. This results in no apparent gaps or breaks between the button 210 and the housing 202, such as that which is typical for most push buttons on electronic devices. Such a uniformly covered button 210 and housing 202 can create a simpler and more aesthetically pleasing appearance to the overall button and device. In addition to providing no gaps or breaks between the button and the housing, cosmetic surface 220 can provide a seal for the interior of the electronic device. In some embodiments, this seal can result in the electronic device being waterproof or at least water resistant, such that the device can be used and operate well under water. Because the cosmetic surface 220 covers the entire button, this cosmetic surface must be able to transfer all of the different types of input there through in order for the button to function properly, as set forth in greater detail below.

In various embodiments, components for button 210 can effectively be considered an electronic device button assembly, which can be configured to be carried by an electronic device housing 202. The electronic device button assembly can include a sensor array that includes all of the button sensors, as set forth in greater detail below, as well as the cosmetic surface 220. The button assembly can also include a support bracket, as set forth below.

Turning next to FIGS. 3A and 3B, the button region of the exemplary portable electronic device of FIG. 2 is shown in side perspective view and side elevation and partially cutaway view respectively. Again, button 210 can be a touch and force sensitive rocker switch, which is configured to sense both touch input events and force input events at the top 211 of cosmetic surface 220 covering the button. Touch events can be sensed at a touch sensor 212 located under the cosmetic surface 220, which touch sensor can be a capacitance sensing panel, for example. Touch sensor 212 can be configured to detect both the location of a touch event, as well as movement across the surface, such as a swipe. Suitable outputs on the electronic device can then reflect the nature of the touch input event at the cosmetic surface 220, which transfers the touch input there through from the outer surface at the top 211 of the cosmetic surface to the touch sensor 212.

Force events can be sensed at one or more force sensors 214 also located under the cosmetic surface 220. Force sensors 214 can be tact switches, dome loaded buttons, a pixelated force sensing panel, or the like. As shown, two force sensors 214 located at both ends of the elongated button 210 can result in the button effectively being a rocker switch. Although two force sensors 214 or button type inputs are shown, it will be readily appreciated that one, three, or more force sensors or button type inputs may be provided. Since button 210 can effectively sense and process both touch and force inputs at its outer surface, the button is a touch and force sensitive rocker switch. An internal bracket structure 230 can provide rigidity and support for the various button components, as noted below.

Figure 4:
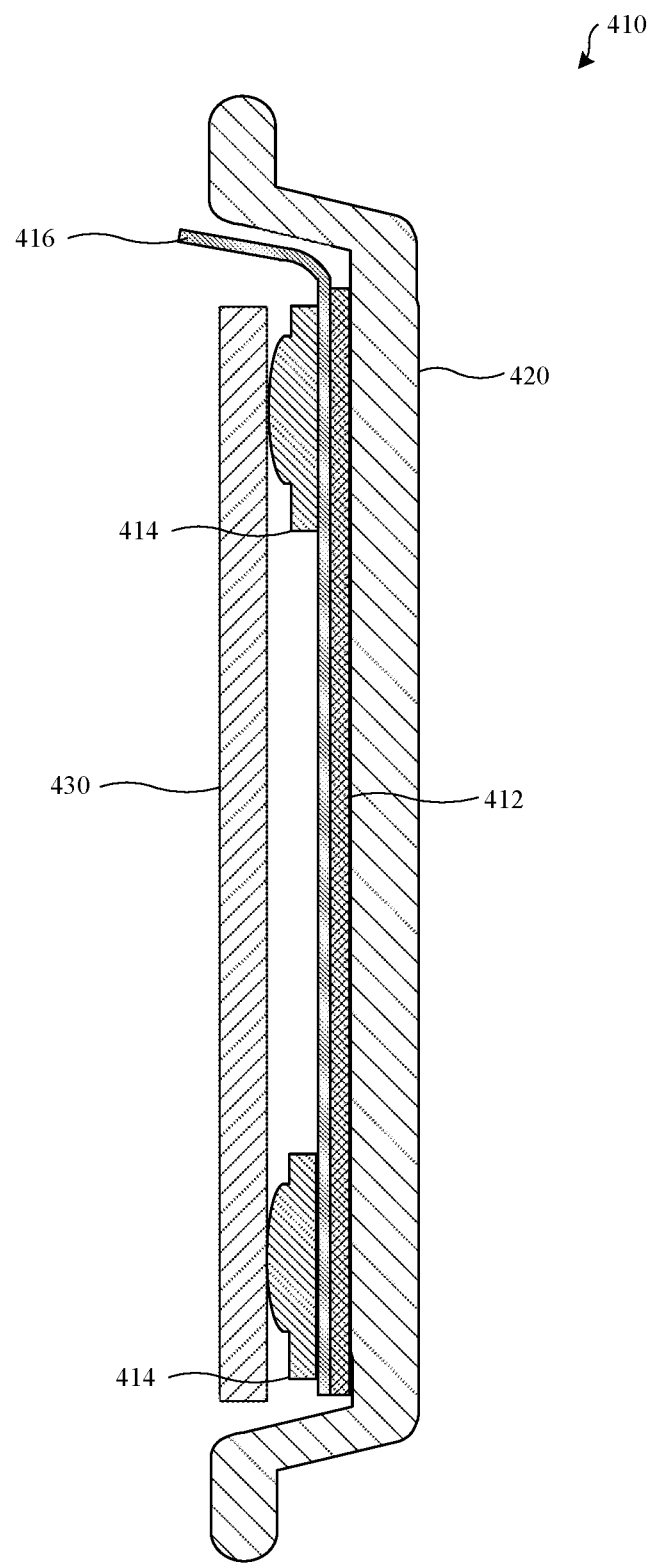
FIG. 4 illustrates in side cross-sectional view an exemplary touch and force sensitive rocker switch according to various embodiments of the present disclosure.

FIG. 4 illustrates in side cross-sectional view an exemplary touch and force sensitive rocker switch according to various embodiments of the present disclosure. Touch and force sensitive rocker switch 410 can be the same as or substantially similar to the examples shown for button 210 above. As in the above examples, touch and force sensitive rocker switch 410 can include a touch sensor 412, which can be a capacitance sensing panel, and two force sensors 414, which can be tact switches, for example. An electrical connector 416 can couple the sensors to a processor or other internal components. The touch sensor 412, force sensors 414, and electrical connector 416 can be located beneath cosmetic surface 420, which can form an overall button assembly with the rest of the button components. Again, cosmetic surface 420 can be configured to transfer the various types of input there through from an outer surface of the button to the various sensors located under the cosmetic surface. An internal bracket structure 430 can be located at an opening in the device housing (not shown) and can be at or about the same level as the device housing. This internal bracket structure can function to provide rigidity and support for the various button components, due to the opening in the housing where the button or touch and force sensitive rocker switch 410 is located.

Again, components for touch and force sensitive rocker switch 410 can effectively be considered an electronic device button assembly, which can be configured to be carried by an electronic device housing (not shown). The electronic device button assembly can include a sensor array that includes all of the button sensors 412, 414, as well as the cosmetic surface 420. The internal bracket structure 430 supports the sensor array and can also be considered a part of the electronic device button assembly. Cosmetic surface 420 can have multiple layers, and can have a varying thickness at different locations, as set forth in greater detail below.

Again, touch and force sensitive rocker switch 410 can suitably replace what would ordinarily be multiple separate input components. In the event of a smart watch, for example, touch and force sensitive rocker switch 410 can effectively replace and provide the functionality of both a scroll wheel and multiple button actuation rocker switches. The touch sensor 412 can be used to sense various kinds of touch events at the outer surface of cosmetic surface 420, and the resulting device outputs can include that which correspond to a scroll wheel. For example, an upward touch swipe at cosmetic surface 420 can result in an upward scrolling of the display on an associated device display. As another example, the force sensors 414 can be tact switches, the use of which can result in outputs such as a menu selection or raising or lower sound output.

Having the swipe or touch input located at a button surface on the side of the device also has the added benefit of allowing for device display inputs that do not require the user to touch the display itself. In most touchscreen uses, requiring the user to touch the display in order to effect an input to the device results in an inconvenient obscuring of at least a portion of the display during the touch event. This disadvantage can be particularly problematic in the event of a relatively small display screen, such as in the case of a smart watch. Accordingly, the touch and force sensitive rocker switch 410 (or other suitable button 210) can have a touch sensor 412 that effectively allows for touchscreen inputs without obscuring the display screen in order to effect the inputs. That is, a simple touch, swipe, gesture, or other touch input at a relative location on the outside of the button can result in an output at a corresponding location on the associated device display. For example, a touch at the lower left of the button can result in an output that is a touchscreen type change as if the lower left of the touchscreen or display had been touched directly.

Figure 5:
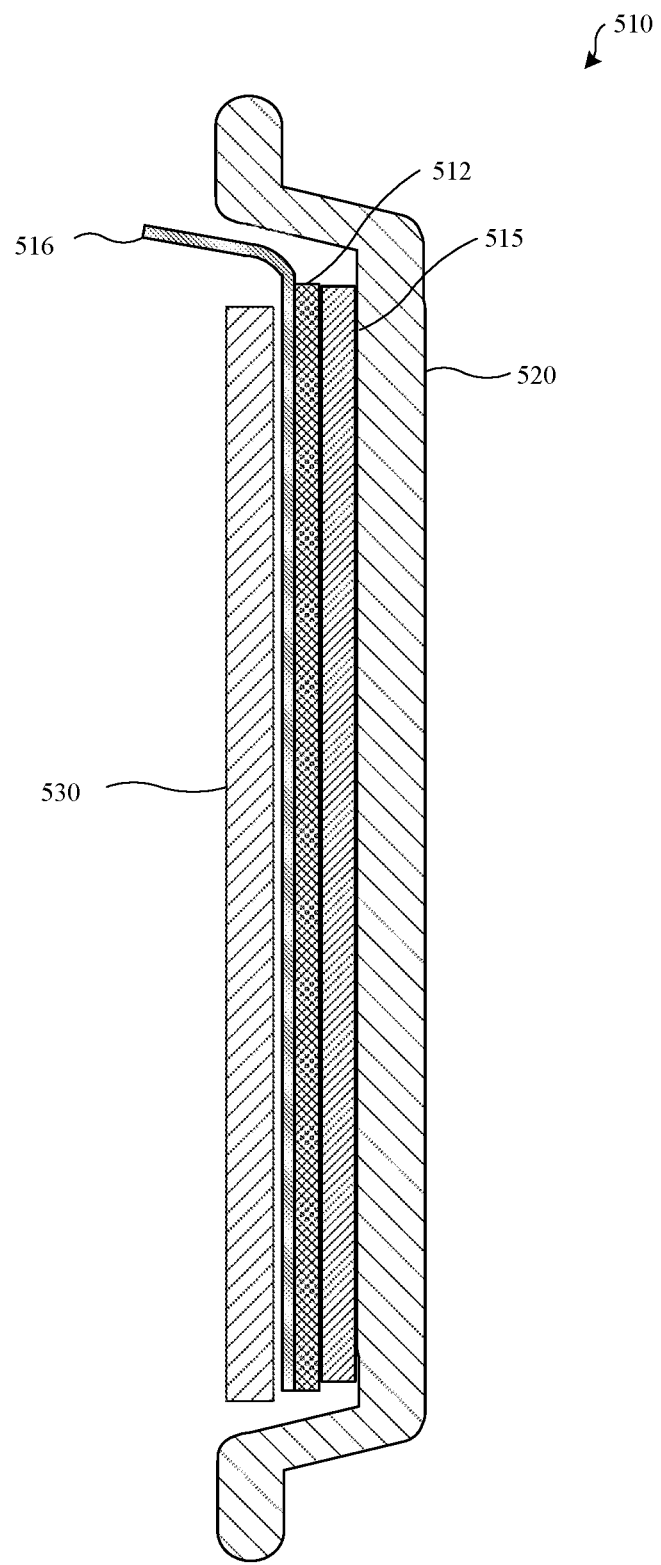
FIG. 5 illustrates in side cross-sectional view an exemplary alternative touch and force sensitive input button according to various embodiments of the present disclosure.

For a different type of force input sensor, FIG. 5 shows in side cross-sectional view an exemplary alternative touch and force sensitive input button. Button 510 can be touch and force sensitive, similar to the foregoing examples. Button 510 can similarly include a touch sensor 512, an electrical connector 516, a cosmetic surface 520, and an internal bracket structure 530, among other button components. However, rather than having tact switches, dome loaded buttons, or other similar force feedback button components, button 510 can have a pixelated force sensing panel 515 configured to detect force at all or various locations on the button. As will be readily appreciated, a suitable pixelated force sensing panel 515 can be configured to detect the amount of force at each pixel on the panel, such that the location and amount of force provided at the surface of the button 510 can be determined. A suitable device output can then correspond to the amount of force provided, as well as the location of the force on the button 510. In various embodiments, the device output can be different for a light force input as compared to a strong force input. For example, the rate of scrolling on an associated display can be faster for stronger force inputs. More than two different levels of output can be provided depending upon the amount of force detected as well, and such levels can resemble analog outputs in some cases.

In various embodiments, an electronic device using button 510 can also provide for a haptic feedback to the user when a force input is sensed. This can be accomplished by way of a haptic engine or other suitable haptic output component on the device. Such a haptic feedback can be desirable where there is no analog force feedback due to the force sensing panel, unlike the natural analog force feedback that a user typically feels for a dome loaded button.

Figure 6:
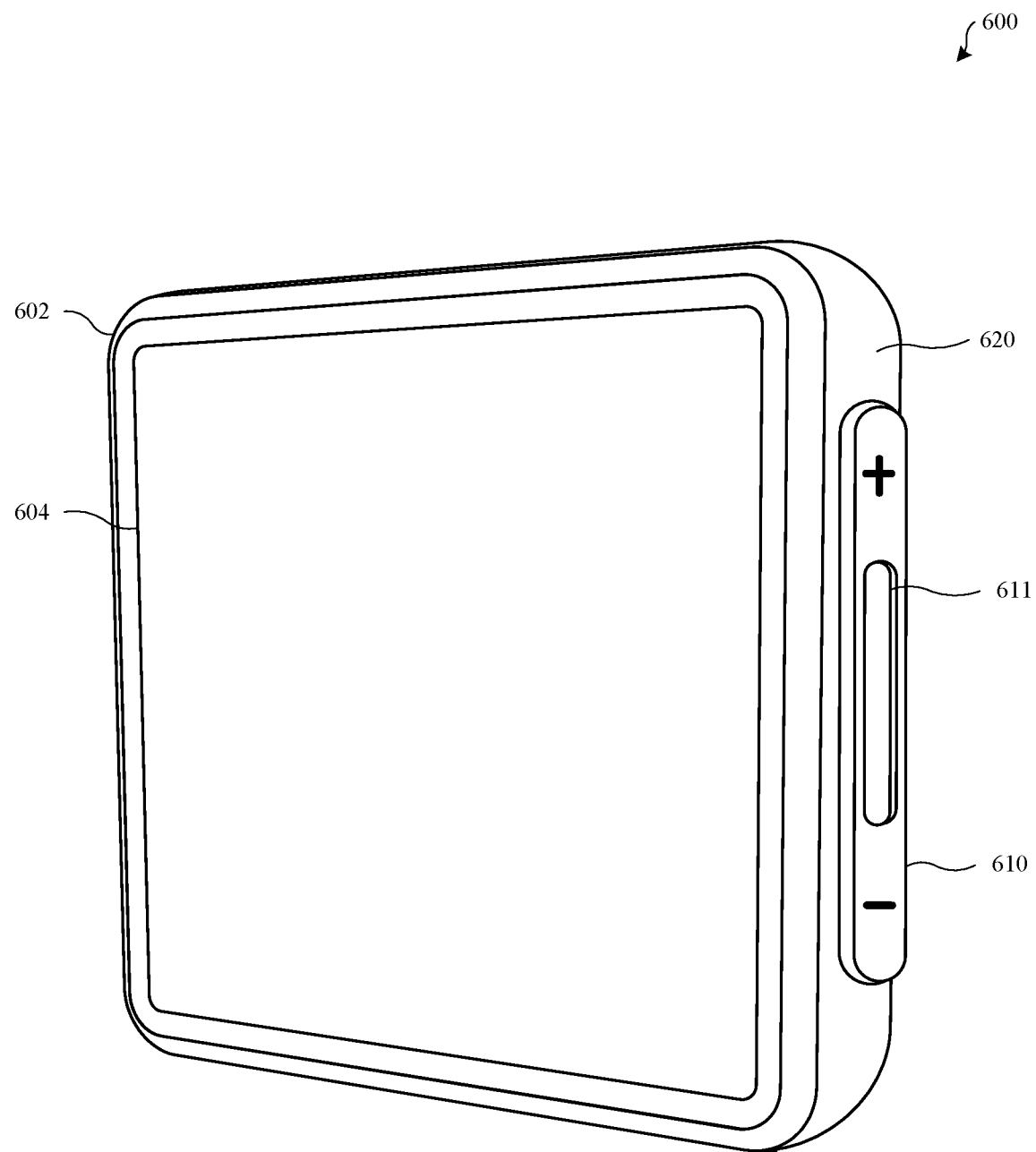
FIG. 6 illustrates in front perspective view still another exemplary portable electronic device according to various embodiments of the present disclosure.

Continuing with FIG. 6, still another exemplary portable electronic device according to various embodiments of the present disclosure is similarly illustrated in front perspective view. Smart watch 600 can be substantially similar to smart watch 200 above, with various exceptions in the button 610. Smart watch 600 can similarly include an outer housing 602 having an interior, front, back, and one or more sides, which housing can be adapted to hold a processor and other electronic components inside. Housing 602 can also provide space for an exterior touchscreen or other display 604, and may also have openings 606 for a separate watch band or strap (not shown). Button 610 can be an alternative specialized multiple input component that is located along a side of housing 602. Button 610 can similarly be a touch and force sensitive rocker switch or other similar multiple input type button, and can be elongated and raised above the surface of the housing 602. A cosmetic surface 620 can similarly cover all of button 610 and at least the portions of the housing 602 that are proximate the button 610.

Button 610 similarly can suitably replace what would ordinarily be multiple separate input components, such as a separate scroll wheel and push button. Cosmetic surface 620 can be identical or substantially similar to cosmetic surface 220 above, and as such can cover the entire button 610 and at least the portions of the housing 602 that are proximate to the button, can result in no apparent gaps or breaks between the button and the housing, and can provide a seal for the interior of the electronic device, which seal can result in the device being waterproof or water resistant. Again, cosmetic surface 620 effectively transfers all of the different types of input there through in order for the button to function properly, as set forth in greater detail below.

Unlike button 210 above, however, button 610 here can be shaped differently, and can also provide for additional locations for force inputs. For example, button 610 can have a detent 611 or lowered profile at the center of the button. This can allow for a user to sense more easily the various locations on the button by feel, such that a suitable input can be provided at the desired location on the button. An additional location for force inputs can include a third tact switch or dome loaded button at the center detent 611 of button 610, for example. In some embodiments, this can allow for force inputs and button depression at the top, center, and bottom of the button 610. Corresponding device outputs can be, for example, volume up (at the top of the button 610), menu selection, and volume down (at the bottom of the button 610). Of course, other types of device outputs can also be possible, and different types of outputs can take place for each force input sensor location depending upon the device mode.

Figure 7:
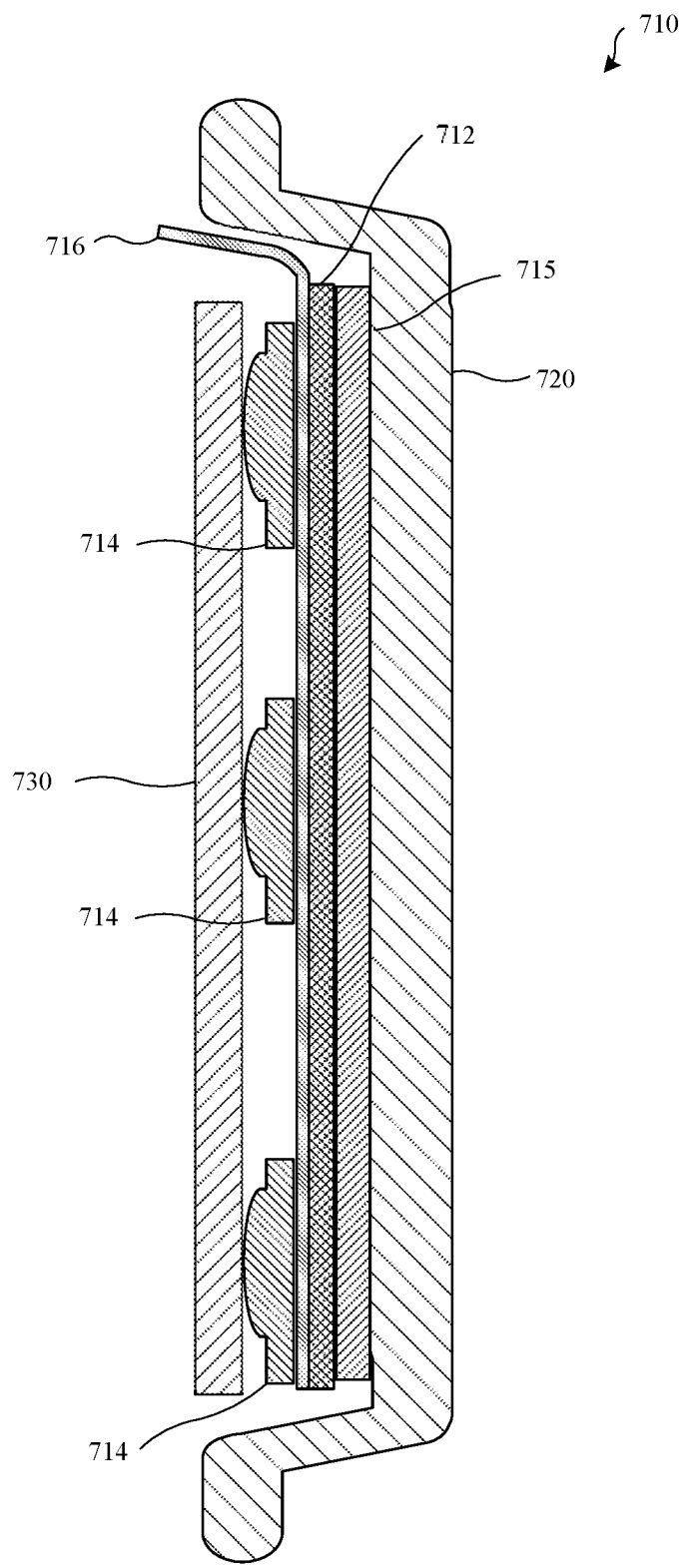
FIG. 7 illustrates in side cross-sectional view another exemplary touch and force sensitive rocker switch according to various embodiments of the present disclosure.

FIG. 7 illustrates in side cross-sectional view another exemplary touch and force sensitive rocker switch according to various embodiments of the present disclosure. Touch and force sensitive rocker switch 710 can be similar to touch and force sensitive rocker switch 210 above, with several notable differences. Similarly, touch and force sensitive rocker switch 710 can include a touch sensor 712, which can be a capacitance sensing panel, and multiple force sensors 714, which can be tact switches, for example, and an electrical connector 716. The touch sensor 712, force sensors 714, and electrical connector 716 can be located beneath cosmetic surface 720, which can form an overall button assembly with the rest of the button components. Again, cosmetic surface 720 can be configured to transfer the various types of input there through from an outer surface of the button to the various sensors located under the cosmetic surface. An internal bracket structure 730 can be located at an opening in the device housing, and can function to provide rigidity and support for the various button components.

Touch and force sensitive rocker switch 710, which can correspond to button 610 on smart watch 600 above, can have an additional force sensor 714, which can be located at the center of the elongated button. As in the case of button 610, this additional force sensor 714 located at the center can provide for an additional depressive button input at a center location. Although examples having two and three tact switches or dome loaded buttons have been shown, it will be readily appreciated that one, three, or more similar force sensors can be used for a given button arrangement. In addition to the three force sensors 714 in the form of tact switches, touch and force sensitive rocker switch 710 can also include a pixelated force sensing panel 715, which can allow for further detection of force locations and varying force levels all along the elongated button. In various embodiments, the force sensors 714 can be used for discrete force inputs and selections, while pixelated force sensing panel 715 can be used for refined force inputs that can vary based on the amount and location of the force, and that can be for different types of output functions. For example, force sensors 714 can be used for outputs of volume up, menu selection, and volume down, while pixelated force sensing panel can be used to determine display screen scroll direction, scroll speed, or both.

Figure 8:
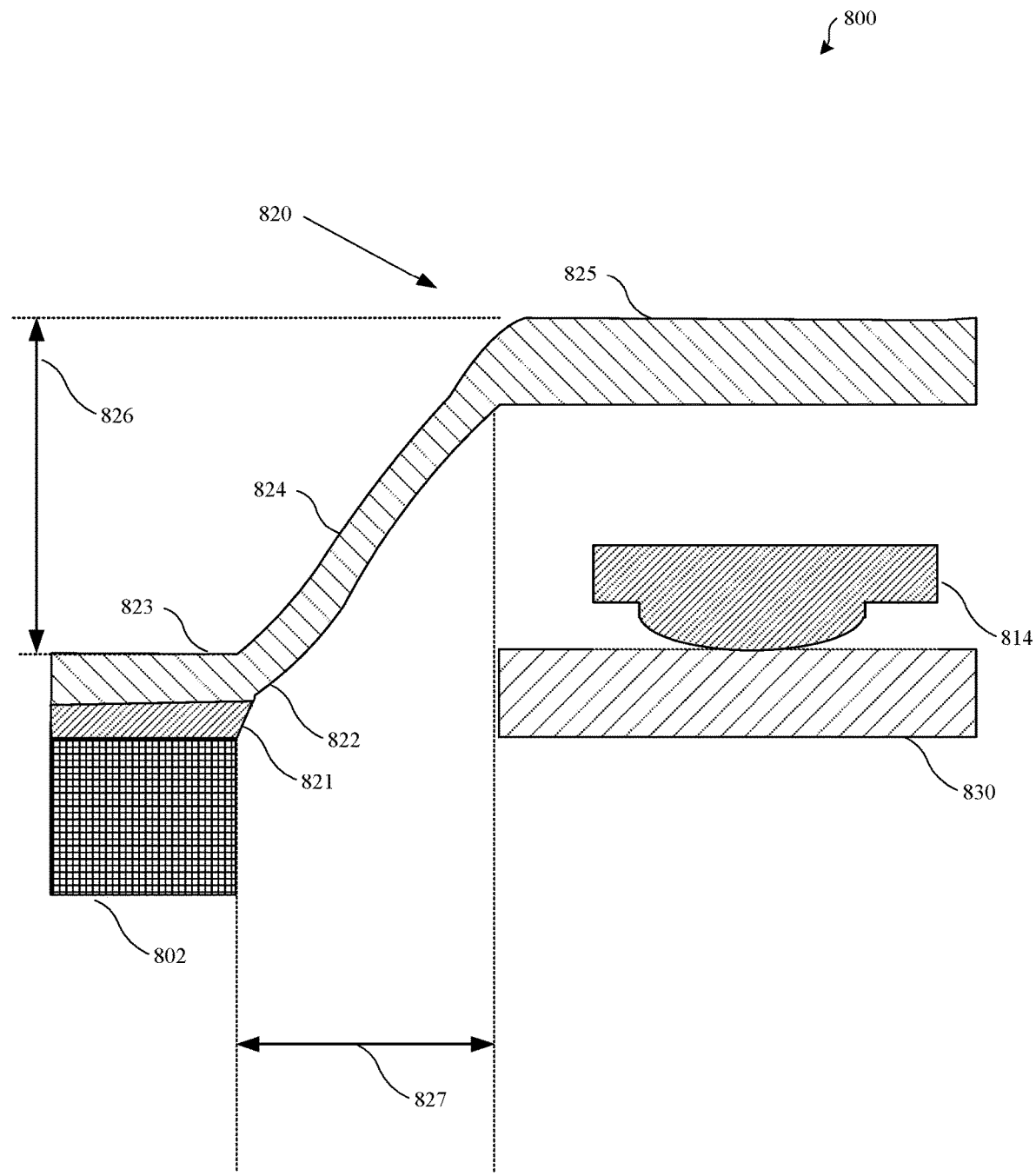
FIG. 8 illustrates in side cross-sectional view an exemplary cosmetic surface for a touch and force sensitive input button according to various embodiments of the present disclosure.

Moving next to FIG. 8, an exemplary cosmetic surface for a touch and force sensitive input button according to various embodiments of the present disclosure is illustrated in side cross-sectional view. Electronic device button assembly 800 can include various components, such as a force sensor 814, an internal bracket structure 830, and a portion of device housing 802 that forms the edge of an opening in the housing for the button assembly. Other button assembly components are not shown here for purposes of simplicity and focus, and such other components are shown and discussed in detail above. In particular, cosmetic surface 820 covers all portions of the button, as well as at least those portions of the housing 802 proximate the button. In some embodiments, cosmetic surface 820 can cover the entire housing 802 as well. By covering the entire button and housing with no gaps or openings therein, cosmetic surface 820 provides a seal for the interior of the associated electronic device, which can make the device waterproof or at least water resistant.

Cosmetic surface 820 also functions to transmit touch and force inputs there through to the various input sensors that are under the cosmetic surface. As such, cosmetic surface 820 can be formed from a suitable material and can be suitably dimensioned to be able to transmit touch and force inputs through the cosmetic surface material. Accordingly, cosmetic surface 820 can be electrically non-conducting, can transmit capacitance there through for touch inputs, and can be sufficiently movable to transmit force inputs there through. In various embodiments, cosmetic surface 820 can be formed from various plastics and flexible polymers, such as silicone and thermoplastic polyurethane, for example, and can be sufficiently thin enough to provide the desired functionalities. In some embodiments, cosmetic surface 820 can be flexible enough to allow for local deformation of the surface itself. A sufficiently soft and thin flexible polymer can be suitable for such use. In other embodiments, cosmetic surface 820 can be more rigid, and the entire surface can tilt or bend together relative to the location of a given force input. Any of the foregoing exemplary embodiments can utilize either type of a locally flexible or more rigid cosmetic surface 820, as may be desired.

As a particular non-limiting example, for purposes of illustration, cosmetic surface 820 can be formed in two different layers, such as by way of a two shot co-molding process. As such, cosmetic surface 820 can have a first layer 821 and a second layer 822. The first layer 821 can be set first atop the housing 820 of the electronic device, and the second layer 822 can be a cosmetic overmold layer formed atop the first layer. In various embodiments, the first layer 821 may cover only portions of the housing 802 and form a foundation for the second layer 822, while the second layer 822 covers all of the button and most or all of the first layer as well.

Cosmetic surface 820 can also include a number of regions, such as a base region 823 over the device housing 802, a flexure region 824 adjacent to the base region, and a button region 825 over the device button and adjacent to the flexure region. Various dimensions for each of these regions 823, 824, 825 can be affected by functional desires, as well as other dimensions present in the button assembly. Such other dimensions can include the offset 826, which is the distance that the button is raised above the surface of the housing 802, as well as the gap 827, which is the distance between the button assembly and the sidewalls of the housing at an opening formed therein for the button assembly.

In various embodiments, it is desirable to allow for some downward movement of the button when a force input is applied thereto. As such, the cosmetic surface 820 should be flexible enough to allow for such movement. In particular, the flexure region 824 between the base region 823 and the button region 825 should be flexible enough to allow for the button to move, while still providing an overall cover and seal for the electronic device. In some arrangements, the thickness of flexure region 824 can be thinner or less than the thickness of either of the base region 823 or the button region 825. In fact, the thickness of flexure region 824 can be tuned or optimized according to the dimensions of the offset 826 and the gap 827. If this thickness is too large, then button movement will be inhibited by too much material in the flexure region 824 and not enough ability to compress. If this thickness is too small, then overall failure of the cosmetic surface 820 at the flexure region 824 can be problematic, particularly due to overall fatigue from device usage. In various embodiments, it may also be desirable for button region 825 to be relatively thick, so as to better withstand long term use and wear. For example, the thickness of button region 825 can be larger than the thickness of flexure region 824. In some embodiments, the offset 826 (which can also be called the "button height" or "proudness") can be about 1.5 to 2.2 mm. In such embodiments, the thickness of the flexure region 824 (which can also be called a "web") can be about 0.5 mm. In addition, the elastomer shore of the web material can be about 86 A while the switch CR can be about 50% in such embodiments.

Figure 9:
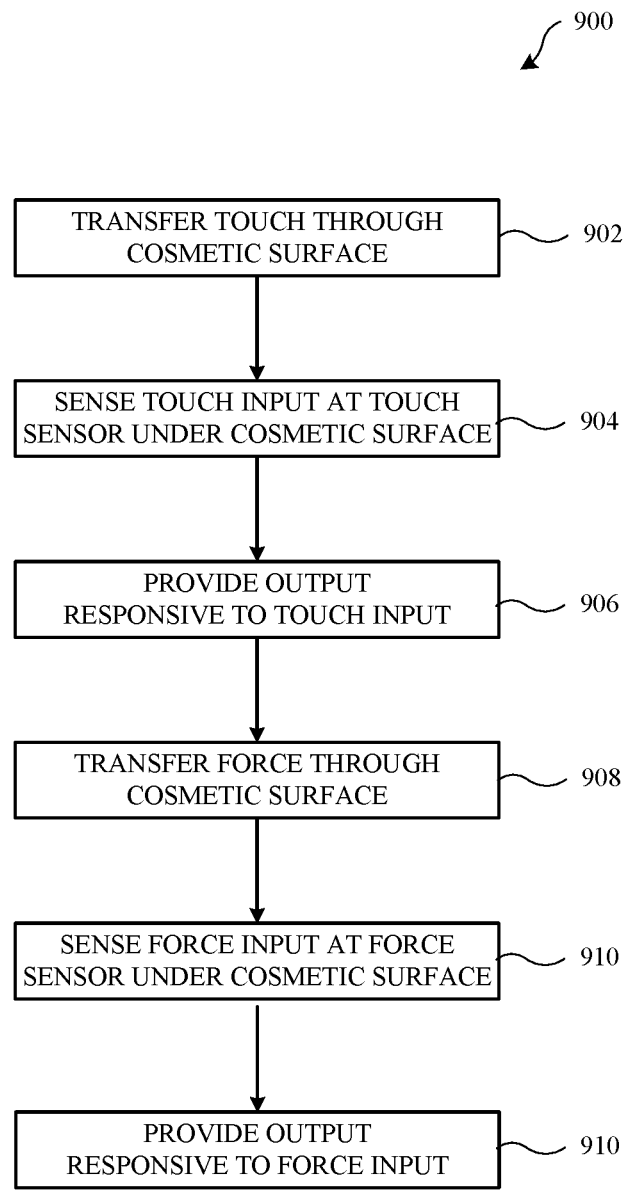
FIG. 9 illustrates a flowchart of an exemplary method for accepting inputs on an electronic device according to various embodiments of the present disclosure.

FIG. 9 illustrates a flowchart of an exemplary method for accepting inputs on an electronic device according to various embodiments of the present disclosure. Method 900 can include process steps that can be performed entirely by a suitable electronic device. At a first process step 902, a touch event at a cosmetic surface covering a button can be transferred through the cosmetic surface. This can be, for example, a user touching, swiping, gesturing, or otherwise providing a touch input at the button. The touch event is then transferred through the cosmetic surface to a touch sensor, such as a capacitance sensor. At the next process step 904, the touch input can then be sensed by the touch sensor under the cosmetic surface. At the following process step 906 an appropriate output responsive to the touch input can then be provided on the electronic device. This can be a change on the display of the electronic device, for example, such as the type of change that might take place where a user were to directly touch a touchscreen of a device. As one example, a swipe along the button can result in a scrolling result on the display of the device. It can be particularly convenient for a user to be able to touch, swipe, or otherwise gesture on a button located along the side of the electronic device in order to effect a display change rather than need to touch the display itself directly, since such a side button touch then does not obscure the display while the user makes the input.

At a process step 908, a force event at the cosmetic surface covering a button can be transferred through the cosmetic surface. This can be, for example, a user pushing downward or otherwise actuating a force input at the button. This force event is then transferred through the cosmetic surface to a force sensor, such as a dome loaded button or a pixelated force panel. At the next process step 910, the force input can then be sensed by the force sensor under the cosmetic surface. At the following process step 912 an appropriate output responsive to the force input can then be provided on the electronic device. This can be a menu selection, a sound, a change on the display of the electronic device, or any other suitable push button output.

For the foregoing flowchart, it will be readily appreciated that not every step provided is always necessary, and that further steps not set forth herein may also be included. For example, added steps that involve flexing downward or providing force feedback may be added. Also, steps that provide detail with respect to the formation of the button or how different types of input are processed can be added as well. Furthermore, the exact order of steps may be altered as desired, and some steps may be performed simultaneously. For example, steps 902 and 908 may be performed together or in reverse order. Simultaneous performance of all steps may also be possible in some instances.

Figure 10:
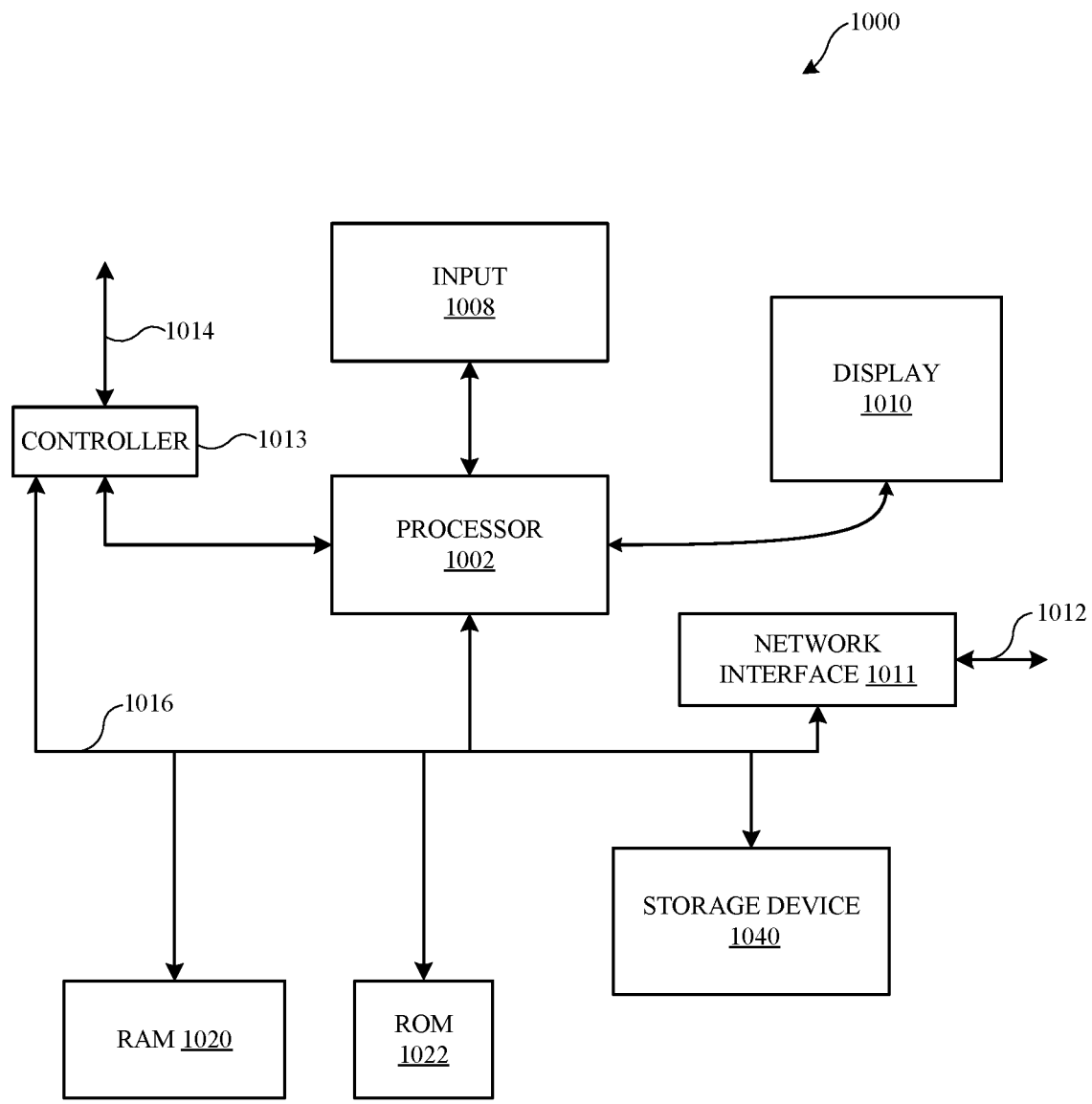
FIG. 10 illustrates in block diagram format an exemplary computing device that can be used to implement the various components and techniques described herein according to various embodiments of the present disclosure.

FIG. 10 illustrates in block diagram format an exemplary computing device 1000 that can be used to implement the various components and techniques described herein, according to some embodiments. In particular, the detailed view illustrates various components that can be included in any of the portable electronic devices 100, 200, and 600 illustrated in FIGS. 1A, 1B, 2 and 6. Again, other types of electronic devices can be used, and it will be understood that only tablet and smart watch devices have been shown and discussed for purposes of simplicity. Such components can include a touch and force sensitive rocker switch or similar input device, as well as a processor that facilitates input from the button and appropriate output, such as by way of that which is set forth in the foregoing examples.

As shown in FIG. 10, the computing device 1000 can include a processor 1002 that represents a microprocessor or controller for controlling the overall operation of computing device 1000. The computing device 1000 can also include a user input device 1008 that allows a user of the computing device 1000 to interact with the computing device 1000. For example, the user input device 1008 can take a variety of forms, such as a button, keypad, dial, touch screen, audio input interface, visual/image capture input interface, input in the form of other sensor data, and the like. In some embodiments, input device 1008 can take the form of a touch and force sensitive rocker switch, button, or other similar device. Still further, the computing device 1000 can include a display 1010 (screen display) that can be controlled by the processor 1002 to display information to the user. A data bus 1016 can facilitate data transfer between at least a storage device 1040, the processor 1002, and a controller 1013. The controller 1013 can be used to interface with and control different equipment through and equipment control bus 1014. The computing device 1000 can also include a network/bus interface 1011 that couples to a data link 1012. In the case of a wireless connection, the network/bus interface 1011 can include a wireless transceiver.

The computing device 1000 can also include a storage device 1040, which can comprise a single disk or a plurality of disks (e.g., hard drives), and includes a storage management module that manages one or more partitions within the storage device 1040. In some embodiments, storage device 1040 can include flash memory, semiconductor (solid state) memory or the like. The computing device 1000 can also include a Random Access Memory (RAM) 1020 and a Read-Only Memory (ROM) 1022. The ROM 1022 can store programs, utilities or processes to be executed in a non-volatile manner. The RAM 1020 can provide volatile data storage, and stores instructions related to the operation of the computing device 1000.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A watch, comprising:
    an enclosure that defines an internal volume, the enclosure comprising a sidewall;
    a switch located in the internal volume; and
    a button protruding through an opening of the sidewall, the button comprising a button surface that defines a single user interface, wherein:
        a first input to the single user interface actuates the switch, and
        a second input to the single user interface generates a haptic feedback to the button surface, the second input different from the first input.

2. The watch of claim 1, further comprising a display screen carried by the enclosure, wherein a third input to the single user interface generates scrolls the display screen.

3. The watch of claim 2, wherein the haptic feedback is provided in conjunction with the scrolling of the display screen.

4. The watch of claim 2, wherein the button is capable of selecting a menu item subsequent to the scrolling of the display screen.

5. The watch of claim 2, wherein the scrolling of the display screen causes a volume change.

6. The watch of claim 2, wherein the display screen comprises a touch screen.

7. The watch of claim 1, wherein the first input causes a depression of the button.

8. The watch of claim 1, wherein a third input with the single user interface causes scrolls information presented on a display screen, and wherein a rate of scrolling of the information on the display screen is based upon the second user interaction to the single user interface.

9. A watch, comprising:
    an enclosure that defines an internal volume, the enclosure comprising sidewall that includes an opening;
    a display screen coupled with the enclosure;
    a haptic engine located in the internal volume; and
    a button protruding from the opening, the button comprising a button surface that defines a single user interface, wherein:
        a first user interaction with the single user interface causes the haptic engine to provide a haptic feedback to the button surface, and
        a second user interaction with the single user interface causes scrolls information presented on the display screen,
        wherein a rate of scrolling of the information on the display screen is based upon the second user interaction to the single user interface.

10. The watch of claim 9, wherein the haptic feedback is provided in conjunction with the scrolling of the display screen.

11. The watch of claim 9, wherein the button is capable of selecting a menu item subsequent to the scrolling of the display screen.

12. The watch of claim 9, wherein a first type input to the button causes a change in visual information presented by the display screen, and wherein a second type input to the button initiated the haptic feedback by the haptic engine, the second type input different from the first type input.

13. The watch of claim 9, further comprising a switch carried by the enclosure, wherein a depression of the button causes an actuation of the switch.

14. The watch of claim 9, wherein the display screen comprises a touchscreen.

15. The watch of claim 9, further comprising a switch located in the internal volume, wherein a third user interaction to the single user interface actuates the switch.

16. A method for controlling a watch having a button and a display screen, the button comprising a button surface that defines a single user interface, the method comprising:
    by a processor of the watch:
    determining a first type input to the single user interface, the first type input configured to actuate a switch in response to the first type input;
    determining a second type input to the single user interface, the second type input different from the first type input; and
    generating a signal that initiates a haptic feedback in response to the second type input, the haptic feedback provided to the button surface.

17. The method of claim 16, further comprising scrolling the display screen by the button.

18. The method of claim 17, further comprising providing the haptic feedback in conjunction with the scrolling of the display screen.

19. The method of claim 16, further comprising selecting a menu item subsequent to the scrolling of the display screen.

20. The method of claim 16, wherein the second type input corresponds to scroll wheel functionality.

* * * * *

UNITED STATES PATENT AND TRADEMARK OFFICE
CERTIFICATE OF CORRECTION

PATENT NO. : 10,734,997 B2
APPLICATION NO. : 16/144901
DATED : August 4, 2020
INVENTOR(S) : Bushnell et al.

Page 1 of 1

It is certified that error appears in the above-identified patent and that said Letters Patent is hereby corrected as shown below:

In the Specification

At Column 8, Line 61, "first atop the housing 820 of the electronic device," should read --first atop the housing 802 of the electronic device,--.

At Column 9, Line 41, "web material can be about 86 A while" should read --web material can be about 86A while--.

In the Claims

In Claim 6, at Column 11, Line 63, "comprises a touch screen." should read --comprises a touchscreen.--.

Signed and Sealed this
Sixth Day of October, 2020

Andrei Iancu
*Director of the United States Patent and Trademark Office*